United States Patent
Zheng et al.

(10) Patent No.: US 9,653,882 B1
(45) Date of Patent: May 16, 2017

(54) WAVELENGTH CONTROL OF AN EXTERNAL CAVITY LASER

(71) Applicant: Oracle International Corporation, Redwood Shores, CA (US)

(72) Inventors: Xuezhe Zheng, San Diego, CA (US); Daniel Y. Lee, San Diego, CA (US); Ashok V. Krishnamoorthy, San Diego, CA (US)

(73) Assignee: ORACLE AMERICA, INC., Redwood Shores, CA (US)

( * ) Notice: Subject to any disclaimer, the term of this patent is extended or adjusted under 35 U.S.C. 154(b) by 0 days.

(21) Appl. No.: 15/019,616

(22) Filed: Feb. 9, 2016

(51) Int. Cl.

| | |
|---|---|
| *H01S 5/0687* | (2006.01) |
| *H01S 5/10* | (2006.01) |
| *H01S 5/14* | (2006.01) |
| *H01S 3/106* | (2006.01) |
| *H01S 3/10* | (2006.01) |
| *H01S 5/30* | (2006.01) |
| *H01S 5/026* | (2006.01) |

(52) U.S. Cl.
CPC ........ *H01S 5/0687* (2013.01); *H01S 3/10053* (2013.01); *H01S 3/1062* (2013.01); *H01S 5/026* (2013.01); *H01S 5/1071* (2013.01); *H01S 5/14* (2013.01); *H01S 5/142* (2013.01); *H01S 5/3013* (2013.01)

(58) Field of Classification Search
CPC .. H01S 5/0687; H01S 5/10053; H01S 3/1062; H01S 5/026–5/0268; H01S 5/1071–5/1075; H01S 5/142
See application file for complete search history.

(56) References Cited

U.S. PATENT DOCUMENTS

| 5,859,866 A * | 1/1999 | Forrest ............... G02B 6/12004 |
| | | 372/19 |
| 6,785,430 B2 * | 8/2004 | Paniccia ................. G02F 1/011 |
| | | 385/10 |

(Continued)

OTHER PUBLICATIONS

Jin-Hyoung Lee, "Demonstration of 12.2% wall plug efficiency in uncooled single mode external-cavity tunable Si/III-V hybrid laser", Optics Express, May 4, 2015, vol. 23, No. 9.

(Continued)

*Primary Examiner* — Joshua King
(74) *Attorney, Agent, or Firm* — Park, Vaughan, Fleming & Dowler LLP

(57) ABSTRACT

An optical source is described. This hybrid external cavity laser includes a semiconductor optical amplifier (with a semiconductor other than silicon) that provides an optical gain medium and that includes a reflector (such as a mirror). Moreover, the hybrid external cavity laser includes a photonic chip with: an optical waveguide that conveys an optical signal output by the semiconductor optical amplifier; and a ring resonator (as a wavelength-selective filter), having a resonance wavelength, which reflects at least a resonance wavelength in the optical signal. Furthermore, the photonic chip includes an interferometer that provides optical signals on arms of the interferometer. Control logic in the hybrid external cavity laser thermally tunes the resonance wavelength to match a cavity mode of the hybrid external cavity laser based on measurements of the optical signals from the interferometer.

20 Claims, 9 Drawing Sheets

(56) References Cited

U.S. PATENT DOCUMENTS

| | | | |
|---|---|---|---|
| 7,257,283 B1 * | 8/2007 | Liu | G02B 6/12004 385/14 |
| 8,767,792 B2 * | 7/2014 | Bowers | H01S 5/0424 372/43.01 |
| 9,450,379 B2 * | 9/2016 | Zhang | H01S 3/005 |
| 2006/0013273 A1 * | 1/2006 | Menon | H01S 5/026 372/32 |
| 2007/0002924 A1 * | 1/2007 | Hutchinson | H01S 5/141 372/98 |
| 2008/0166134 A1 * | 7/2008 | McCallion | G02B 6/12007 398/187 |
| 2009/0154505 A1 * | 6/2009 | Oh | G02B 6/12007 372/20 |
| 2011/0310918 A1 * | 12/2011 | Yoon | H01S 5/026 372/26 |
| 2012/0189025 A1 * | 7/2012 | Zheng | H01S 5/1071 372/20 |
| 2013/0003766 A1 * | 1/2013 | Savchenkov | G04F 5/14 372/38.01 |
| 2013/0016744 A1 * | 1/2013 | Li | B82Y 20/00 372/20 |
| 2013/0243020 A1 * | 9/2013 | Kim | H01S 5/0224 372/36 |
| 2015/0277053 A1 * | 10/2015 | Zheng | G02B 6/29341 385/31 |

OTHER PUBLICATIONS

Shiyun Lin, "Vertical-coupled high-efficiency tunable III-V-CMOS SOI hybrid external-cavity laser", Optics Express, Dec. 30, 2013, vol. 21, No. 26.

Jonathan A. Cox, "Wavelength control of resonant photonic modulators via balanced homodyne locking", IEEE Optical Interconnect Conference 2013, vol. 2, No. Dc, pp. 15-16.

Xuezhe Zheng, "Efficient WDM Laser Sources Towards Terabyte/s Silicon Photonic Interconnects", J. Light. Technol., vol. 31, No. 24, pp. 4142-4154, 2013.

* cited by examiner

WAVELENGTH CONTROL OF AN EXTERNAL CAVITY LASER

GOVERNMENT LICENSE RIGHTS

This invention was made with U.S. government support under Agreement No. HR0011-08-9-0001 awarded by DARPA. The U.S. government has certain rights in the invention.

BACKGROUND

Field

The present disclosure relates to the design of an optical source. More specifically, the present disclosure relates to the wavelength control of an external cavity laser with reduced optical mode-hopping.

Related Art

Silicon photonics is a promising technology candidate for dense, large-bandwidth interconnects for use in next-generation processing and computing systems. Considerable progress has been made to develop a comprehensive portfolio of optical components for such advanced intra/inter-system interconnects, including laser light sources.

While a monolithic silicon light source remains elusive, silicon-assisted hybrid external cavity lasers have proven promising. A hybrid external cavity laser often includes a material section as an electrically pumped optical gain medium, and a silicon mirror as the other reflector in the external cavity, as well as an output coupler. This is illustrated in FIG. 1, which presents an example of an existing hybrid external cavity laser. While FIG. 1 illustrates a vertically coupled hybrid external cavity laser that uses a grating coupler to couple the light from a reflective semiconductor optical amplifier (RSOA) into a silicon optical waveguide in a silicon-on-insulator (SOI) technology, other hybrid external cavity lasers are edge-coupled and use tapered edge couplers to couple the light into the silicon optical waveguide. Note that some hybrid external cavity lasers use ultra-efficient tunable silicon photonic reflectors (e.g., silicon micro-rings or ring resonators) to control and tune the wavelength of the laser, and thus to create a tunable laser. Moreover, a directional coupler between the optical gain chip and the ring-resonant filter is used for laser output, and an optional phase tuner on silicon can be used to fine-tune the alignment of the lasing cavity mode to the ring-resonant-filter resonance.

The principle of a hybrid external cavity (silicon-assisted) laser is shown in FIG. 2. The optical cavity mode (which is one of the allowed standing waves in the optical cavity) that experiences the highest reflection from the tunable silicon ring resonator may dominate the natural optical mode competition in the laser and achieve stable lasing (as shown by the bold vertical line in FIG. 2). A current-adjustment mechanism in the hybrid external cavity laser may be used to control the current injected into the reflective semiconductor optical amplifier. This current can control the amount of output power available from the hybrid external cavity laser. Moreover, a resonance-adjustment mechanism in the hybrid external cavity laser may change the resonance wavelength of the tunable silicon ring resonator, which controls the cavity lasing wavelength and the emission wavelength.

However, tunable silicon photonic reflectors are often very sensitive to temperature changes. For example, as the current is increased, heating of the hybrid external cavity laser may occur, which can change the effective length of the external hybrid optical cavity because of the thermo-optic effect and, thus, can red-shift the cavity modes (as shown by the other vertical lines in FIG. 2). In particular, because the optical gain and laser section is long (typically, greater than 500 μm in length), the cavity modes are spaced narrowly, with multiple cavity modes present within a resonance of a single ring resonator. Although the injected current can reduce the effective index of refraction (which may partially compensate for this effect) and a tunable silicon photonic reflector may also be used to change the lasing wavelength, the overall effect of temperature is that the specific cavity mode may experience reduced reflectivity as it shifts to a longer wavelength. When another cavity mode achieves the highest effective optical gain, then this other cavity mode typically becomes the dominant lasing mode (and may lase preferentially over the previous incumbent lasing optical mode), and the hybrid external cavity laser experiences a hop in the lasing wavelength corresponding to the new cavity mode (and, in particular, a sudden laser optical-mode jump to another cavity mode).

During data transmission, wavelength optical mode-hops are essentially 'glitches' that can corrupt data transmitted, or may send data to the incorrect destination in a wavelength-division-multiplexed (WDM) system. Consequently, optical mode-hopping is undesirable for digital communication links and typically needs to be reduced before a tunable hybrid external cavity laser may be effectively used for transmitting high-speed data across a range of wavelengths with good fidelity across the communication channel.

One approach for maintaining the alignment between the ring resonator and a lasing cavity mode is to minimize the output at monitoring port(s). For example, a closed-loop controller can maintain the alignment by using the monitor-port output power as a feedback signal to control the ring-resonator heater or the cavity phase tuner in order to minimize the optical power at the monitor port(s). While this approach is simple, efficient and has low power consumption, the feedback is relative because of the symmetric shape of the monitor output or error signal. Consequently, there is no single absolute value indicating perfect alignment. This means that the feedback signal has no 'direction' information that can be used to guide the controller to correct any errors that occur. Therefore, a so-called 'try and check' type of control technique (e.g., a so-called 'bang-bang' feedback technique) may be needed for closed-loop control.

Furthermore, the controller usually relies on a prior feedback signal (such as a previous sample, T−1) as a reference to determine the appropriate correction for the current sample (T). However, laser-power change due to other effects (such as laser-current change) can result in the wrong corrective action and, thus, the usefulness of this power-monitoring approach may be limited to situations where the optical power is not fluctuating.

Hence, what is needed is a hybrid external cavity laser without the above-described problems.

SUMMARY

One embodiment of the present disclosure provides an optical source that includes a semiconductor optical amplifier, defined in a semiconductor other than silicon, which has a first edge and a second edge. This semiconductor optical amplifier includes a reflective coating on the first edge, and provides an optical signal having a carrier wavelength at the second edge. Moreover, the optical source includes a photonic chip, which is optically coupled to the semiconductor optical amplifier.

The photonic chip includes: a first optical waveguide having a third edge, optically coupled to the second edge of the semiconductor optical amplifier, and a fourth edge, where the first optical waveguide conveys the optical signal; a ring resonator optically coupled to the first optical waveguide between the third edge and the fourth edge, where the ring resonator drops a portion of the optical signal and passes a remainder of the optical signal; and an interferometer, optically coupled to the fourth edge, that receives the remainder of the optical signal and a reflected optical signal, and provides a first output signal on a first arm of the interferometer and a second output signal on a second arm of the interferometer. Furthermore, the photonic chip includes: a second optical waveguide having a fifth edge, optically coupled to the interferometer, and a sixth edge, where the second optical waveguide is optically coupled to the ring resonator between the fifth edge and the sixth edge, and conveys the reflected optical signal.

Additionally, the photonic chip includes: a loop mirror, optically coupled to the sixth edge, that reflects some of the portion of the optical signal conveyed in the second optical waveguide as the reflected optical signal and outputs a remainder of the portion of the optical signal; photodetectors, optically coupled to the first arm and the second arm, that respectively measure the first output signal and the second output signal; and control logic, electrically coupled to the photodetectors, that tune a resonance wavelength of the ring resonator to match a cavity mode of the optical source based on the measurements of the first output signal and the second output signal.

In some embodiments, the optical source includes a thermal-tuning mechanism electrically coupled to the control logic and thermally coupled to the ring resonator, where the control logic tunes the resonance wavelength using the thermal-tuning mechanism.

Note that the control logic may tune the resonance wavelength of the ring resonator based on a difference of the measurements of the first output signal and the second output signal.

Moreover, the optical source may include: a first phase-tuning mechanism, optically coupled to the first optical waveguide, that adjusts a phase of the optical signal; and a second phase-tuning mechanism, optically coupled to the second optical waveguide, that adjusts a phase of the reflected optical signal.

Furthermore, the first optical waveguide may include a waveguide loop to balance the interferometer by adjusting a phase of the remainder of the optical signal.

Additionally, the interferometer may include an optical coupler between the first optical waveguide and the second optical waveguide.

In some embodiments, the loop mirror includes a directional coupler with its two output ports optically coupled to each other to form a loop.

Note that, when the resonance wavelength is aligned with the cavity mode, a difference of the measurements of the first output signal and the second output signal may be zero.

Moreover, the photonic chip may include: a substrate; a buried-oxide layer disposed on the substrate; and a semiconductor layer disposed on the buried-oxide layer, where optical components are defined in the semiconductor layer. For example, the substrate, the buried-oxide layer and the semiconductor layer may constitute a silicon-on-insulator technology.

In another embodiment of the optical source, a portion of the optical signal is output at the fourth edge of the first optical waveguide, and the ring resonator optically couples a remainder of the optical signal from the first optical waveguide. Moreover, an interferometer may be optically coupled to the fifth edge of the second optical waveguide. This interferometer may receive a reflected optical signal and another portion of the remainder of the optical signal, and may provide a first output signal on a first arm of the interferometer and a second output signal on a second arm of the interferometer. Furthermore, the photonic chip may include a third optical waveguide having a seventh edge, optically coupled to the interferometer, and an eighth edge.

Additionally, the photonic chip may include a loop mirror, optically coupled to the sixth edge and the eighth edge, that reflects a portion of the remainder of the optical signal as the reflected optical signal in the second optical waveguide, and passes the other portion of the remainder of the optical signal in the third optical waveguide. Photodetectors, optically coupled to the first arm and the second arm, may respectively measure the first output signal and the second output signal, and control logic, electrically coupled to the photodetectors and the thermal-tuning mechanism, may tune a resonance wavelength of the ring resonator to match a cavity mode of the optical source based on the measurements of the first output signal and the second output signal.

In some embodiments, the optical source includes: a first phase-tuning mechanism, optically coupled to the first optical waveguide, that adjusts a phase of the optical signal; and a second phase-tuning mechanism, optically coupled to the third optical waveguide, that adjusts a phase of the other portion of the remainder of the.

Note that the second optical waveguide may include a waveguide loop to balance the interferometer by adjusting a phase of the reflected optical signal in the second optical waveguide.

Moreover, the interferometer may include an optical coupler between the second optical waveguide and the third optical waveguide.

Furthermore, the photonic chip may include a power splitter, optically coupled to the third optical waveguide between the seventh edge and the eighth edge, that outputs an output optical signal on a second arm of the power splitter; and a fourth optical waveguide having a ninth edge, optically coupled to the power splitter, and a tenth edge, that, during operation, outputs the output optical signal.

Another embodiment provides a system that includes: a processor; a memory that stores a program module; and one of the embodiments of the optical source. During operation, the program module is executed by the processor.

Another embodiment provides a method for locking a cavity mode for one of the embodiments of the optical source.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
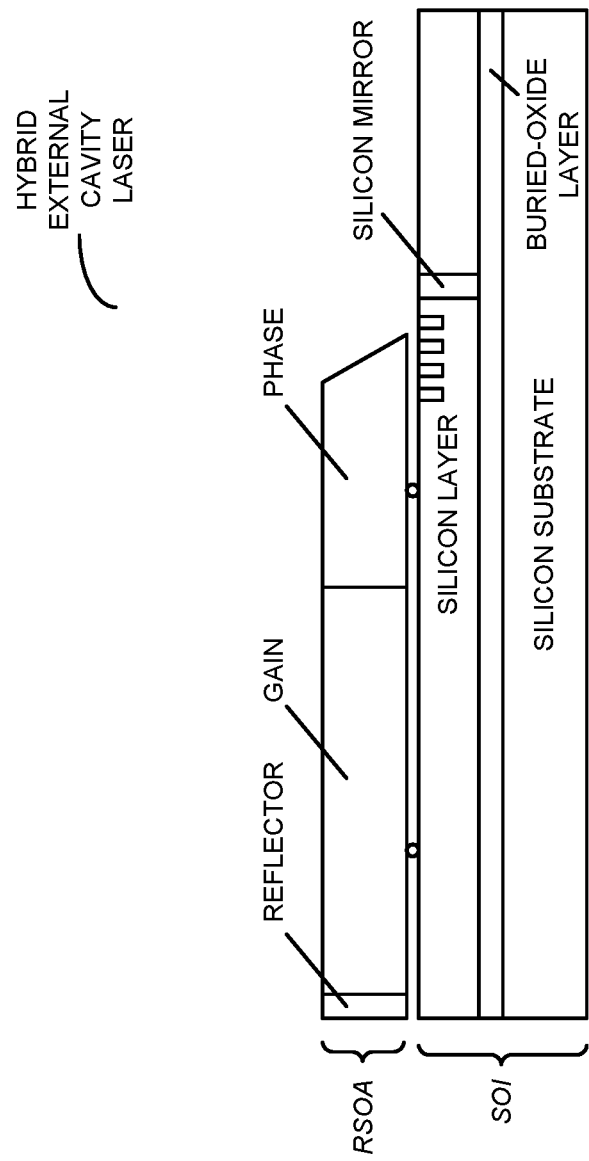
FIG. 1 is a drawing illustrating an existing hybrid external cavity laser.
Figure 2:
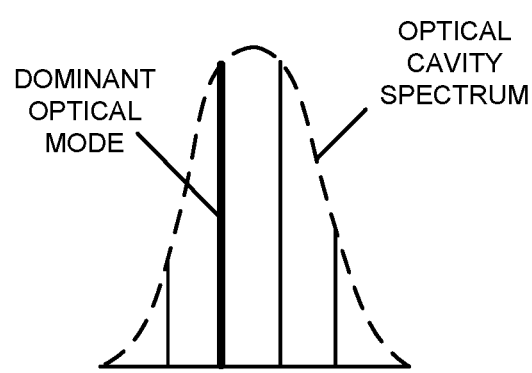
FIG. 2 is a drawing illustrating the operating principle of the existing hybrid external cavity laser of FIG. 1.

Embodiments of an optical source (such as a hybrid external cavity laser), a system that includes the hybrid external cavity laser, and a technique for locking a cavity mode for an external cavity laser are described. The hybrid external cavity laser includes a semiconductor optical amplifier (with a semiconductor other than silicon) that provides an optical gain medium and that includes a reflector (such as a mirror). Moreover, the hybrid external cavity laser includes a photonic chip with: an optical waveguide that conveys an optical signal output by the semiconductor optical amplifier; and a ring resonator (as a wavelength-selective filter), having a resonance wavelength, which reflects at least a resonance wavelength in the optical signal. Furthermore, the photonic chip includes an interferometer that provides optical signals on arms of the interferometer. Control logic in the hybrid external cavity laser thermally tunes the resonance wavelength to match a cavity mode of the hybrid external cavity laser based on measurements of the optical signals from the interferometer.

By measuring the optical signals provided by the interferometer, the hybrid external cavity laser can dynamically be tuned to the carrier wavelength (and, more generally, desired laser characteristics) without optical mode-hops as the injected current into the hybrid external cavity laser is changed or the temperature changes. In particular, the monitoring and feedback techniques in the hybrid external cavity laser may be used to ensure stable laser operation and to minimize optical mode-hops by controlling and stabilizing the laser mode. For example, the measurements of the optical signals may be used to continuously detect potential instabilities in the hybrid external cavity laser, and to control a feedback loop that adjusts the resonance wavelength and/or a phase shift to force the laser to operate in an optical mode-hop-free condition. In this way, the hybrid external cavity laser can avoid data glitches or corruption associated with optical mode-hops. Therefore, the hybrid external cavity laser can provide a low-cost, compact, energy-efficient optical source for use in inter-chip and intra-chip connections, such as wavelength-division-multiplexing (WDM) silicon-photonic links. Furthermore, the hybrid external cavity laser may help facilitate high-speed inter- and intra-chip silicon-photonic interconnects, as well as associated systems that can include this component (such as high-performance computing systems).

We now describe embodiments of the optical source, such as a hybrid external cavity laser (which is used as an illustration). As discussed previously, laser stability is typically an important requirement in high-speed communication applications, particularly for energy-efficient, high-speed photonic integrated circuits. Because of the difficulty of monolithic integration of optical gain media (such as compound semiconductors) onto silicon, hybrid external cavity lasers have been investigated. In a hybrid external cavity laser, a semiconductor optical amplifier based on a compound semiconductor provides optical gain (e.g., at or near 1.3 or 1.55 µm) and a silicon photonic chip provides circuits with wavelength selectivity and feedback, and an output coupler to the rest of the circuits in the silicon photonic chip. However, an important effect impacting laser stability is mode-hopping, which can occur when external parameters are changed (such as the temperature, a pumping condition and/or because of unwanted back-reflection from the rest of the silicon photonic chip). The last is an especially important issue in a hybrid external cavity laser where the optical cavity spans multiple chips and interfaces. Note that optical mode-hopping may result in high-intensity noise, uncontrolled lasing wavelengths and sudden optical-power variation, which can severely degrade the laser performance and may limit its application to high-fidelity optical communication.

These challenges can be addressed by making one or more changes in the structure of the hybrid external cavity laser, thereby achieving a low-noise, single-mode laser. The described changes may concurrently or independently be used to reduce the amount of optical mode-hopping, and a subset with one or more of these changes may be applied to a given hybrid external cavity laser (i.e., not all changes may be simultaneously needed).

Figure 3:
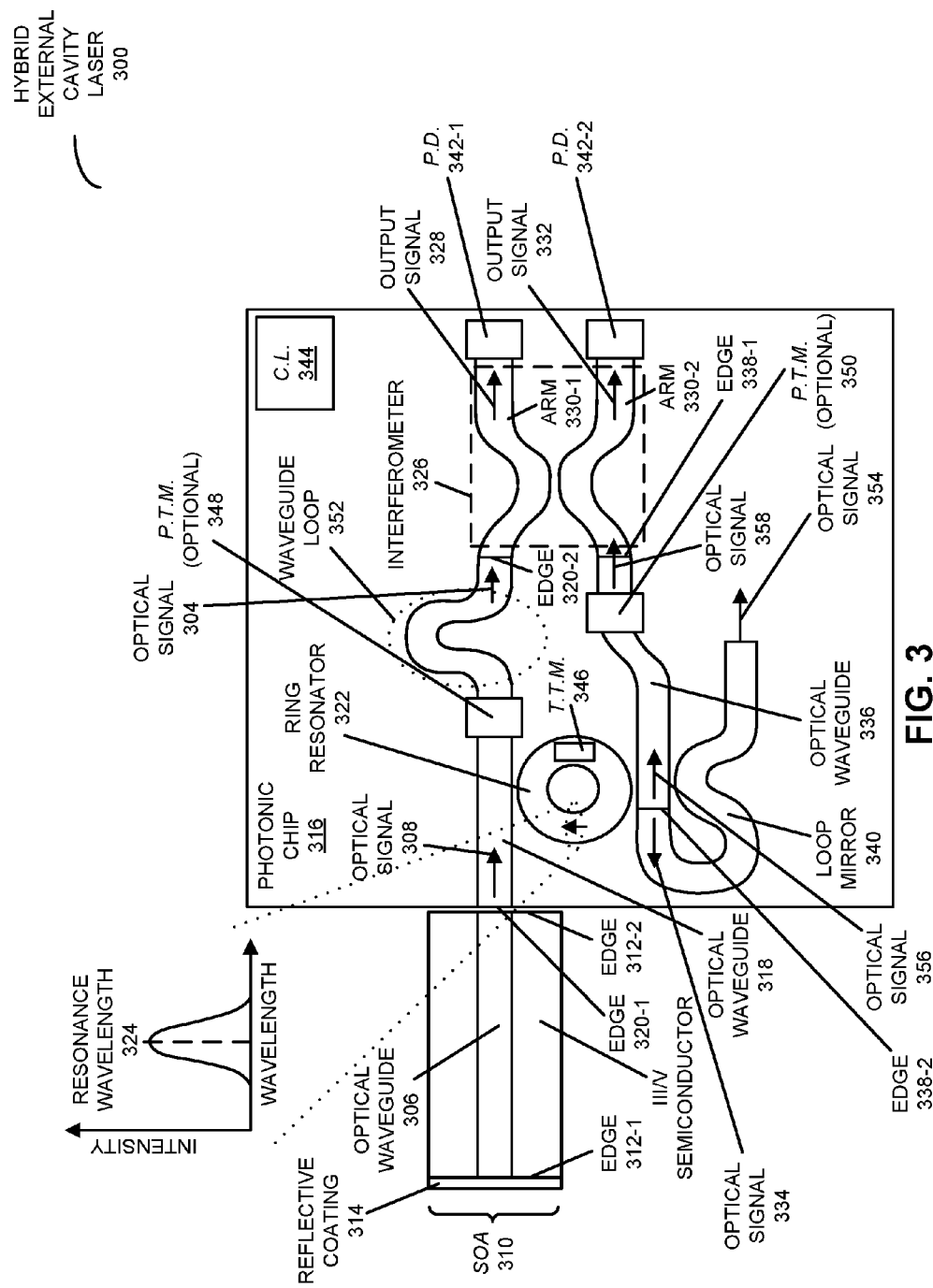
FIG. 3 is a block diagram of a hybrid external cavity laser in accordance with an embodiment of the present disclosure.

FIG. 3 presents a block diagram of a hybrid external cavity laser 300. This hybrid external cavity laser includes: a semiconductor optical amplifier (SOA) 310 defined in a semiconductor other than silicon (such as a compound semiconductor or a semiconductor having a direct bandgap, e.g., gallium-arsenide, indium-phosphide, erbium or germanium) having edges 312. This semiconductor optical amplifier includes a reflective coating (or layer) 314 (such as a strong distributed Bragg reflector, a notched mirror, metal layer, etc.) on edge 312-1 (therefore, semiconductor optical amplifier 310 may be a reflective semiconductor optical amplifier), and an optical waveguide 306 in semiconductor optical amplifier 310 may provide an optical signal 308 at edge 312-2. In particular, optical signal 308 may have an associated carrier or fundamental wavelength λ, such as 1.3 or 1.55 µm.

Moreover, hybrid external cavity laser 300 includes a photonic chip 316 optically coupled to semiconductor optical amplifier 310. This photonic chip includes: an optical waveguide 318, having edge 320-1 (optically coupled to edge 312-2) and edge 320-2, that conveys optical signal 304 (which is a portion or a remainder of optical signal 308); a ring resonator 322 (and, more generally, a wavelength-selective filter or reflector), optically coupled to optical waveguide 318 between edges 320 (and, more specifically, ring resonantor 322 may be optically coupled between edge 320-1 and a waveguide loop 352) and having a resonance wavelength 324, which drops another portion or remainder of optical signal 308 (i.e., optical signal 334) to optical waveguide 336 (which is then propagating to the left towards edge 338-2).

Furthermore, photonic chip 316 includes: an interferometer 326 (such as a Mach-Zehnder interferometer), optically coupled to edge 320-2, that receives optical signals 304 and 358, and provides an output signal 328 on an arm 330-1 of interferometer 326 and an output signal 332 on an arm 330-2 of interferometer 326. Additionally, photonic chip 316 includes: optical waveguide 336, having edge 338-1 (optically coupled to interferometer 326), and edge 338-2, where optical waveguide 336 is optically coupled to ring resonator 322 between edges 338.

Photonic chip 316 also includes loop mirror 340 (such as a directional coupler with its two output ports optically coupled to each other to form a loop), optically coupled to edge 338-2, that reflects a portion of optical signal 334 as optical signal 356 back towards edge 338-1 and outputs a remainder of optical signal 334 as optical signal 354. (Thus, loop mirror 340 provides a second mirror in hybrid external cavity laser 300 that defines the optical cavity, and provides output optical signal 354, although an output from hybrid external cavity laser 300 may be extracted in a variety of ways.) Moreover, photonic chip 316 includes: photodetectors (P.D.s) 342, optically coupled to arms 330, that respectively measure output signals 328 and 332; and control logic (C.L.) 344 (which may be a circuit implemented in silicon), electrically coupled to photodetectors 342 and a thermal-tuning mechanism 346, that tune resonance wavelength 324 of ring resonator 322 using thermal-tuning mechanism 346 to match a cavity mode of hybrid external cavity laser 300 based on the measurements of output signals 328 and 332.

In particular, a portion of optical signal 356 passes ring resonator 322 in optical waveguide 336 and becomes optical signal 358 at edge 338-1 optically coupled to the bottom arm of interferometer 326, and a remainder of optical signal 356 gets dropped to optical waveguide 318 through the ring resonator 322 (and propagates to the left towards edge 320-1). Optical signals 304 and 358 will then interfere through the directional coupler of interferometer 326 and produce two mixed optical signals 328 and 332 going into photodetectors 342-1 and 342-2, respectively. Moreover, control logic 344 may subtract electrical signals from photo detectors 342 to produce a feedback signal, and control logic 344 may then align resonance wavelength 324 of ring resonator 322 with the lasing cavity mode. For example, based on electrical signals from control logic 344 (which are based on the measured optical signals 328 and 332), thermal-tuning mechanism (T.T.M.) 346 (such as a silicon-based resistive heater or a resistive metal heater), which is thermally coupled to ring resonator 322, adjusts the temperature of the ring resonator 322. In this way, resonance wavelength 324 is tuned to a target carrier wavelength or a particular cavity mode of an optical cavity in hybrid external cavity laser 300 (which is defined by reflective coating 314 and a loop mirror 340, and which is described below).

Note that control logic 344 may tune resonance wavelength 324 based on a difference of the measurements of output signals 328 and 332. When resonance wavelength 324 is aligned with the cavity mode, a difference of the measurements of output signals 328 and 332 may be zero.

Thus, the feedback-control system may be an electronic control unit (such as control logic 344) that is capable of monitoring photocurrent from integrated photodetectors 342 and driving tuning power to thermal-tuning mechanism 346 based on a feedback-control technique and/or one or more phase-tuning mechanisms (which may be statically tuned, as described further below). Alternatively, hybrid external cavity laser 300 may include an interface (not shown) that receives wavelength-feedback information from an optional external wavelength sensor (not shown), and control logic 344 may use this wavelength-feedback information to tune hybrid external cavity laser 300.

Control logic 344 may be integrated with hybrid external cavity laser 300 either monolithically on photonic chip 316 or heterogeneously using flip-chip bonding to a VLSI circuit. Using the feedback-control technique, the laser operation can be actively stabilized so that the lasing cavity mode is locked to resonance wavelength 324, which allows the lasing cavity mode and resonance wavelength 324 to be continuously synchronized and to drift together regardless of external influences. Because the feedback system can monitor the optical power intensity in real-time (or with a sufficient sampling rate), the control-system design and monitoring configuration may be simplified. As described further below, the phase of hybrid external cavity laser 300 may also be controlled using an optional temperature-compensation element, which may reduce the amount of the co-drift.

In some embodiments, hybrid external cavity laser 300 includes: an optional phase-tuning mechanism (P.T.M.) 348 (such as a heater or by using electrical carrier injection), optically coupled to optical waveguide 318, that adjusts a phase of optical signal 308; and an optional phase-tuning mechanism (P.T.M.) 350 (such as a heater or by using electrical carrier injection), optically coupled to optical waveguide 336, that adjusts a phase of optical signal 358. The phase tuning may be included in photonic chip 316 because phase tuning can be done thermally (e.g., by heating optical waveguide 318 using a heater or a resistor) without causing additional free-carrier absorption loss (which often results when electrical carrier injection is used to tune phase). However, a large effective phase-tuning range (several multiples of $2\pi$) may be required, so one or more additional mechanisms for reducing the phase-tuning range may be used. For example, optical waveguide 318 may include waveguide loop 352 to properly adjust the interferometer by adjusting a phase of optical signal 304.

Additionally, interferometer 326 may include an optical coupler (not shown) between optical waveguide 318 and optical waveguide 336.

In some embodiments, the feedback-control technique in hybrid external cavity laser 300 is based on balanced homodyne interferometry in which an error signal is generated with an absolute-zero crossing point corresponding to perfect alignment between resonance wavelength 324 of ring resonator 322 and the laser cavity mode independent of the laser power fluctuation caused by other effects. In addition, the sign of the feedback signal further indicates the action direction for control logic 344 to correct the error signal. This feedback-control technique can be used to eliminate mode-hopping in hybrid external cavity lasers.

In particular, the homodyne interferometer mixes optical signals on the through-port outputs of ring resonator 322 using interference through interferometer 326 (such as a 3 dB directional coupler), i.e., homodyne interference, followed by conversion of optical signals 328 and 332 output from interferometer 326 to electrical signals using two photodetectors 342 with the same responsivity, and finally the subtraction of the electrical signals from photodetectors 342.

Figure 4:
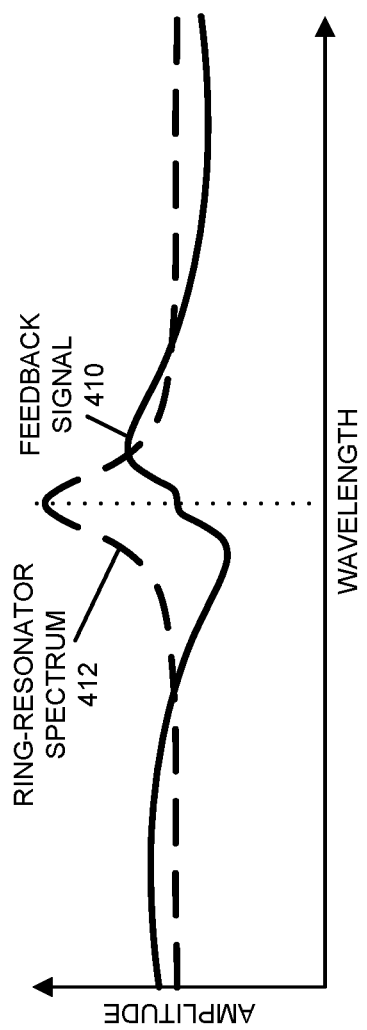
FIG. 4 is a drawing of a feedback signal provided by control logic in the hybrid external cavity laser of FIG. 3 in accordance with an embodiment of the present disclosure.

As shown in FIG. 4, which presents a drawing of a feedback signal 410 at different lasing wavelengths provided by control logic 344 (FIG. 3) in hybrid external cavity laser 300 (FIG. 3), an optimal feedback signal 410 results when the path lengths of the two interferometer arms 330 (FIG. 3) are properly adjusted. For reference, the dotted line shows ring-resonator spectrum 412. Note that arms 330 (FIG. 3) can be properly adjusted using an extra waveguide loop 352 in conjunction with optional phase-tuning mechanisms 348 and/or 350. While FIG. 3 illustrates optional phase-tuning mechanism 348 to the right of ring resonator 322 on optical waveguide 318, in other embodiments optional phase-tuning mechanism 348 may be to the left of ring resonator 322 on optical waveguide 318. In FIG. 4, when the lasing wavelength is aligned with resonance wavelength 324 (FIG. 3), feedback signal 410 is zero regardless of the laser output power. Moreover, when the lasing wavelength walks off to the left of ring resonance 324 (FIG. 3), feedback signal 410 has a negative sign and vice versa for lasing wavelength walk-off to the right side of ring resonance 324 (FIG. 3). Note that the magnitude of feedback signal 410 increases monotonically with the amount of walk-off over a range of lasing wavelengths (such as wavelengths associated with optical modes in the optical cavity). This is a typical S-shape feedback error signal that can be used for closed-loop control. For example, adjusting thermal-tuning mechanism 346 (FIG. 3) and/or optional phase-tuning mechanisms 348 and/or 350 to zero out feedback signal 410, the alignment between the lasing mode and resonance wavelength 324 (FIG. 3) can be adjusted and maintained during operation.

However, note that the slope of feedback signal 410 near zero crossing reduces to near zero. In other words, the zero crossing point is at an inflection point on the feedback-signal curve, which can result in a dead band for closed-loop control because feedback signal 410 changes very little within the dead band (which is not good for the feedback control). The root cause of this inflection is that optical signals 304 and 358 going into interferometer 326 in FIG. 3 approach their intensity minima when ring resonator 322 is aligned with the lasing cavity mode. Such dead bands can be eliminated using the balanced homodyne laser-wavelength control technique shown in FIG. 5, which presents a block diagram of a hybrid external cavity laser 500, in which the feedback signal is non-zero when the error signal goes through zero.

Figure 5:
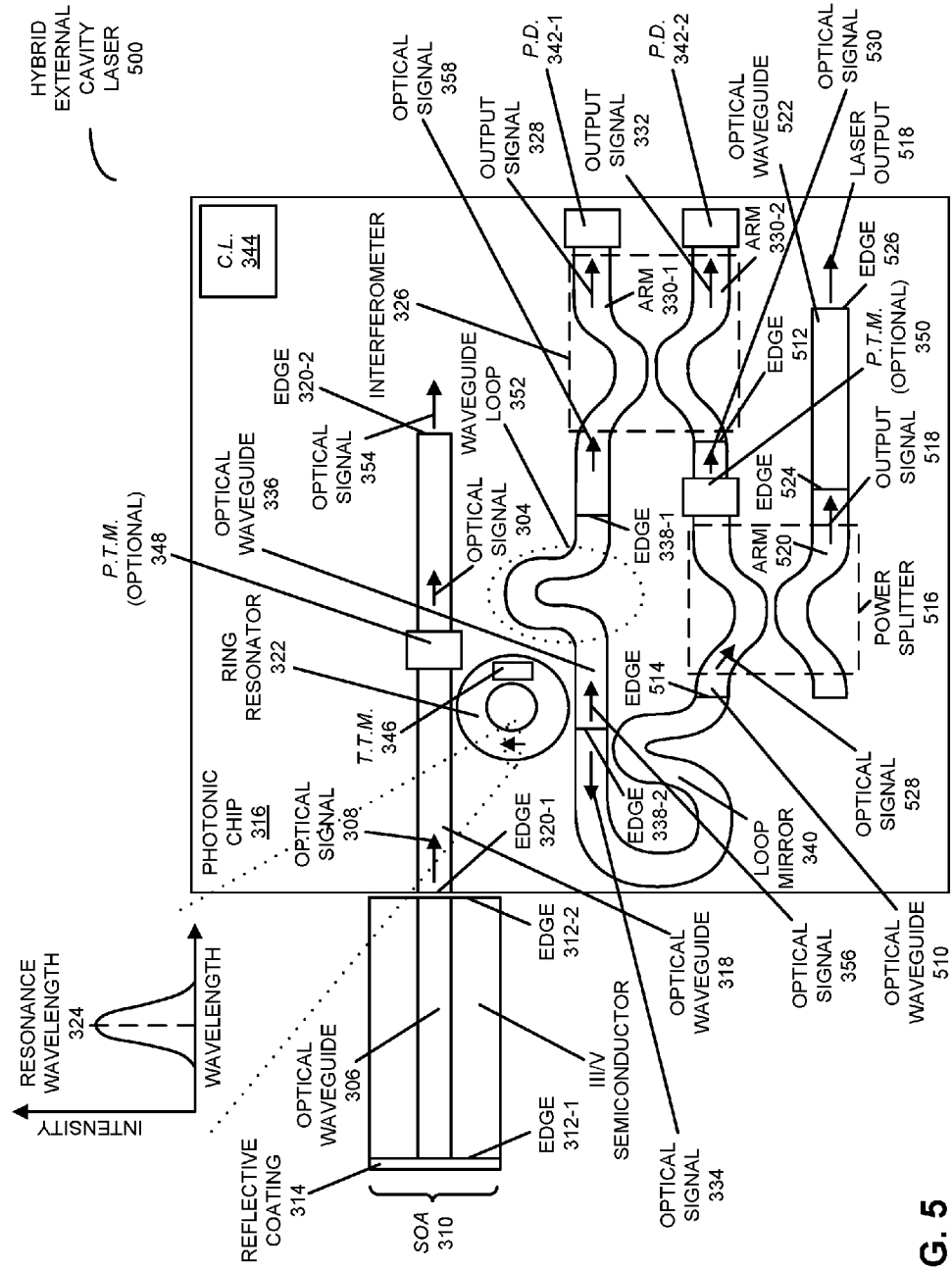
FIG. 5 is a block diagram of a hybrid external cavity laser in accordance with an embodiment of the present disclosure.

In particular, in FIG. 5, a portion of the optical signal 304 (which is a portion of optical signal 308) is output at edge 320-2 of optical waveguide 318, and ring resonator 322 drops a portion (or a remainder) of optical signal 308 (i.e., optical signal 334) to optical waveguide 336 (which is then propagating to the left towards edge 338-2). Moreover, an interferometer 326 may be optically coupled to edge 338-1 of optical waveguide 336. This interferometer may receive optical signals 358 and 530, and may provide an output signal 328 on arm 330-1 of interferometer 326 and an output signal 332 on arm 330-2 of interferometer 326. Furthermore, photonic chip 316 may include an optical waveguide 510 having an edge 512, optically coupled to interferometer 326, and an edge 514.

Additionally, photonic chip 316 may include loop mirror 340, optically coupled to edges 338-2 and 514, that passes a portion of optical signal 334, i.e., optical signal 528, and reflects another portion of the remainder of optical signal 308, i.e., optical signal 356, back towards edge 338-1.

Furthermore, photonic chip 316 may include: power splitter 516, optically coupled to optical waveguide 510 between edges 512 and 514, that splits optical signal 528 and outputs a laser output signal 518 on an arm 520 of power splitter 516; and an optical waveguide 522 having an edge 524, optically coupled to power splitter 516, and an edge 526, that outputs laser output 518. In addition, power splitter 516 may pass an optical signal 530 toward edge 512.

Photodetectors 342, optically coupled to arms 330, may respectively measure output signals 328 and 332, and control logic 344, electrically coupled to photodetectors 342, may tune resonance wavelength 324 of ring resonator 322 to match a cavity mode of hybrid external cavity laser 500 based on the measurements of output signals 328 and 332.

In particular, a portion of optical signal 356 passes ring resonator 322 in optical waveguide 336 and becomes optical signal 358 at edge 338-1 optically coupled to the top arm of interferometer 326, and a remainder of optical signal 356 gets dropped to optical waveguide 318 through the ring resonator 322 (and propagates to the left towards edge 320-1). Optical signals 358 and 530 will then interfere through the directional coupler of interferometer 326 and produce two mixed optical signals 328 and 332 going into photodetectors 342-1 and 342-2, respectively. Moreover, control logic 344 may subtract electrical signals from photo detectors 342 to produce a feedback signal, and control logic 344 may then align resonance wavelength 324 of ring resonator 322 with the lasing cavity mode.

In some embodiments, hybrid external cavity laser 500 includes: optional phase-tuning mechanism 348, optically coupled to optical waveguide 318, that adjusts a phase of optical signal 308; and optional phase-tuning mechanism 350, optically coupled to optical waveguide 510, that adjusts a phase of optical signal 530. While FIG. 5 illustrates optional phase-tuning mechanism 348 to the right of ring resonator 322 on optical waveguide 318, in other embodiments optional phase-tuning mechanism 348 may be to the left of ring resonator 322 on optical waveguide 318.

Note that optical waveguide 336 may include waveguide loop 352 to properly adjust interferometer 326 by adjusting a phase of optical signal 358 in optical waveguide 336.

Moreover, interferometer 326 may include an optical coupler (not shown) between optical waveguides 318 and 336.

In this improved laser-wavelength control technique, homodyne interference is implemented using part of the laser output and ring-resonator through-port output on the side of loop mirror 340. Similarly, waveguide loop 352 in conjunction with optional phase-tuning mechanisms 348 and/or 350 can be used to balance the optical path length of the two interferometer arms 330. Note that the other ring-resonator through-port not used for homodyne interference can be used as an additional laser output port or as a laser-power monitoring port.

Figure 6:
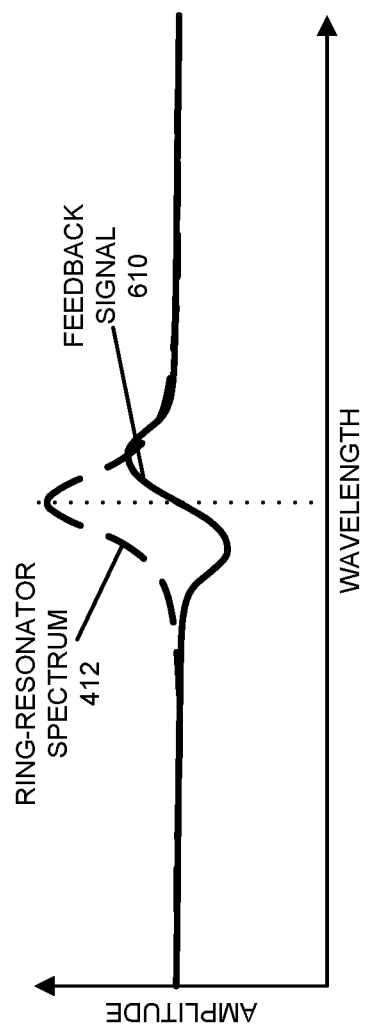
FIG. 6 is a drawing of a feedback signal provided by control logic in the hybrid external cavity laser of FIG. 5 in accordance with an embodiment of the present disclosure.

Applying the same signal 'mixing' approach described previously, a feedback signal without a dead band can be obtained. This is shown by the solid line in FIG. 6, which presents a drawing of a feedback signal 610 as a function of lasing wavelength provided by control logic 344 (FIG. 5) in hybrid external cavity laser 500 (FIG. 5). In FIG. 6, the zero-crossing point, which is independent of the laser output power, serves as an indicator of the alignment of resonance wavelength 324 (FIG. 5) with the lasing cavity mode. With feedback signal 610, closed-loop feedback control can be implemented to robustly align ring resonator 322 (FIG. 5) with the lasing cavity mode, thereby eliminating mode-hoping for a hybrid external cavity laser with a ring-resonator filter.

Note that the feedback-control technique can be used with other types of silicon-assisted lasers with different resonant-mirror structures, including: a racetrack resonator, a disc resonator, a photonic-crystal resonator structure, etc. Furthermore, the feedback-control technique can be used with higher-order resonant-mirror structures, such as a dual resonator (e.g., a $2^{nd}$-order filter), as well as higher-order resonator-based filters.

Referring back to FIG. 3, semiconductor optical amplifier 310 may be edge-coupled to photonic chip 316, such as facet-to-facet optical coupling. This edge-to-edge coupling may be facilitated by using a wide optical waveguide 306 in semiconductor optical amplifier 310 (such as a width of 2-3 µm), and optical waveguide 318 may have a width of several hundred nanometers. Alternatively, semiconductor optical amplifier 310 may be surface-normal coupled to photonic chip 316. For example, semiconductor optical amplifier 310 may be flip-chip bonded onto photonic chip 316, and the surface-normal coupling may involve etched or angled mirrors or grating couplers (such as a diffraction grating), and/or optical proximity communication (such as using reflective mirrors and/or evanescent coupling).

Figure 7:
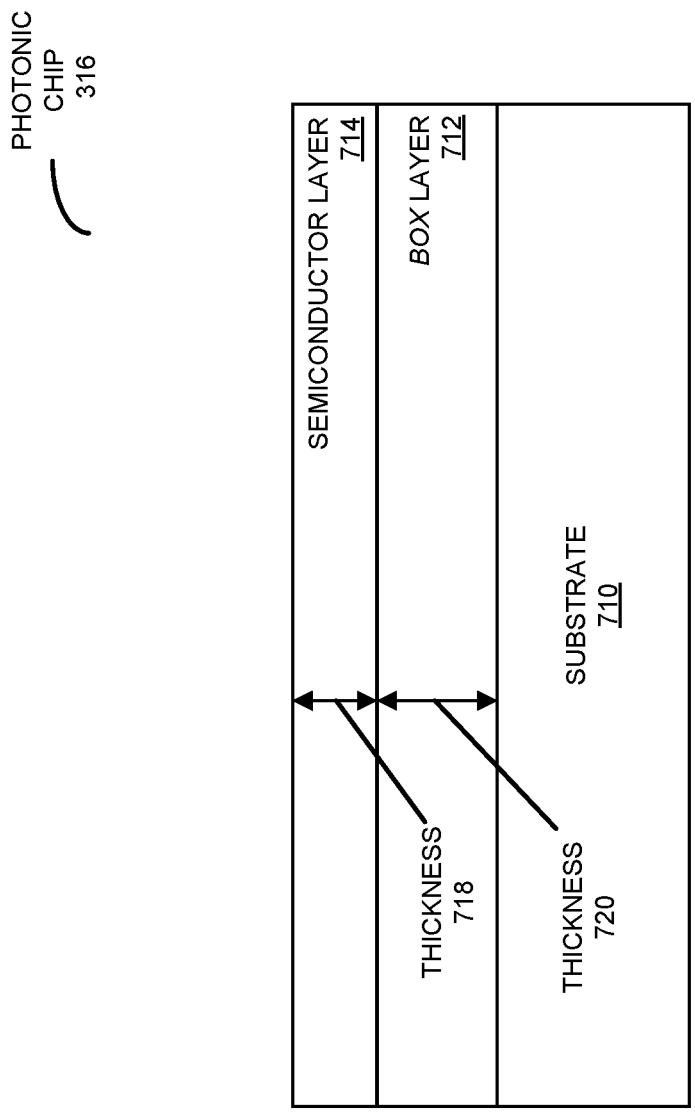
FIG. 7 is a block diagram of a side view of a photonic chip in a hybrid external cavity laser in accordance with an embodiment of the present disclosure.

Moreover, as shown in FIG. 7, which presents a side view of photonic chip 316, photonic chip 316 may include: a substrate 710; a buried-oxide layer 712 disposed on substrate 710; and a semiconductor layer 714 disposed on buried-oxide layer 712, where optical waveguide 318 (FIG. 3), ring resonator 322 (FIG. 3), interferometer 326 (FIG. 3) and optical waveguide 336 (FIG. 3) are defined in semiconductor layer 714. For example, substrate 710, buried-oxide layer 712 and semiconductor layer 714 may constitute a silicon-on-insulator technology. Thus, substrate 710 and semiconductor layer 714 may include silicon, and buried-oxide layer 712 may include silicon dioxide.

In an exemplary embodiment, the fundamental or carrier wavelength of optical signal 308 in FIG. 3 is between 1.1-1.7 µm. For example, optical signal 308 may have a carrier wavelength of 1.3 or 1.55 µm. Moreover, semiconductor layer 714 may have a thickness that is less than 1 µm (such as 0.2-0.5 µm). For example, semiconductor layer 714 may have a thickness 718 of 0.3 µm. Furthermore, buried-oxide layer 712 may have a thickness 720 between 0.3 and 3 µm (such as 0.8 µm).

In some embodiments, ring resonator 322 is a very narrowband ring-resonator filter with resonance having a full width at half maximum (FMHW) that is less than the optical-mode spacing associated with the (hybrid) optical cavity. This may ensure that only a few cavity modes (or, preferably, only one cavity mode) may exist within the passband of the ring-resonator filter. For example, ring resonator 322 may have a radius of 5 µm, and a free-spectral range (FSR) of about 20 nm. Consequently, a ring-resonator filter with a high quality factor may be used as the tuning mirror. Alternatively or additionally, other tunable mirror structures may be used. Note that a narrowband ring-resonator filter may ideally isolate the target optical mode and, thus, may make it easier to sense the optimum location of the optical mode with respect to the ring-resonator filter (e.g., by monitoring optical signals 328 and 332 and minimizing their difference by finely adjusting resonance wavelength 324 of the ring-resonator filter in order to minimize the amount of power bypassing the ring-resonator filter into optical waveguides 318 and 336). Moreover, because at a given time only one cavity mode may be preferentially lasing, hybrid external cavity laser 300 may monitor optical signals 328 and 332 even if there are a few optical modes accepted by the ring-resonator filter, and may optimize a given lasing optical mode with respect to the ring-resonator filter. This may allow this optical mode to be locked even as the injected current into hybrid external cavity laser 300 (and, thus, the output power) changes.

While these capabilities may allow hybrid external cavity laser 300 to prevent optical mode-hopping by locking onto a given cavity mode, the lasing wavelength may move because the given lasing cavity mode may (red-) shift versus current (because of internal heating) and as a function of ambient temperature. Consequently, in some embodiments hybrid external cavity laser 300 includes an optional temperature-compensation element, optically coupled to optical waveguides 318 and 336 (and/or to the optical waveguide in semiconductor optical amplifier 310), which compensates for a temperature dependence of indexes of refraction of optical waveguides 318 and 336. For example, the optional temperature-compensation element may include a titanium-dioxide optical waveguide to compensate for first-order changes in the cavity-mode spacing as a function of temperature and, thus, effectively annul the phase change in the optical cavity, which may reduce the phase-tuning range needed for tuning, optimization and/or wavelength drift. Note that reducing the phase-tuning range of drift versus temperature may be important for the overall link and system (especially, for multi-wavelength transmission on a single optical waveguide) in order to ensure that the carrier wavelength remains within a fixed window.

In particular, as discussed in "Temperature-Insensitive Optical Component," by Stevan Djordjevic, Xuezhe Zheng, Jin Yao, John E. Cunningham, Kannan Raj and Ashok V. Krishnamoorthy, U.S. patent application Ser. No. 14/567,239, filed on Dec. 11, 2014, the contents of which are hereby incorporated herein by reference, global temperature stability of the optical cavity may be achieved by canceling out the red-shift (i.e., to longer wavelengths) of an optical waveguide in semiconductor optical amplifier 310 and optical waveguides 318 and 336 in photonic chip 316 by an equivalent blue-shift (i.e., to shorter wavelengths) of an amorphous titanium-dioxide ($TiO_2$) core optical waveguide (which may be integrated on photonic chip 316). In addition, a temperature-insensitive reflector may be achieved by cancelling the thermo-optic coefficient of (silicon-core) optical waveguides 318 and 336 with that of an amorphous titanium-dioxide upper-cladding (or overcladding) material having a thermo-optic coefficient (TOC) of $-2.15 \cdot 10^{-4}$ $K^{-1}$. More generally, the upper-cladding material may have a large negative thermo-optic coefficient, a medium index of refraction (e.g., an index of refraction equal to 2.420 in the mid-infrared), and/or may be CMOS-compatible. (However, photonic chip 316 and/or hybrid external cavity laser 300 may avoid the use of polymer materials, such as polyurethane acrylates, having a negative TOC, which often suffer from relaxation, photo-aging, moisture absorption and other adverse properties that usually make them unacceptable in CMOS processing.) Therefore, using this passive approach, hybrid external cavity laser 300 may have significantly reduced temperature dependence (which is sometimes referred to as 'athermal' operation) even in the absence of cooling (and, more generally, temperature control).

Additionally, hybrid external cavity laser 300 may include at least an optional temperature sensor, electrically coupled to the control logic 344, which determines a parameter associated with a temperature, and control logic 344 may modify a phase in the optical cavity (via optional phase-tuning mechanisms 348 and/or 350) and/or resonance wavelength 324 of ring resonator 322 (via thermal-tuning mechanism 346) to adjust the carrier wavelength based on the determined parameter. For example, the phase may be modified in semiconductor optical amplifier 310 and/or photonic chip 316. Note that the parameter may be associated with at least a temperature of semiconductor optical amplifier 310 (i.e., the optional temperature sensor may be in or proximate to semiconductor optical amplifier 310) and/or a temperature of photonic chip 316 (i.e., the optional temperature sensor may be in or proximate to photonic chip 316), either or both of which may be related to a case temperature of a package for hybrid external cavity laser 300. Thus, the optional temperature sensor may directly measure the temperature (e.g., using a resistor, a diode, a band-gap reference, etc.) or indirectly measure the parameter associated with the temperature (such as based on a physical property or characteristic that is a function of the temperature). Note that the measured parameter may allow control logic 344 to determine if there are differential changes in temperature that may not be fully compensated for by the optional temperature-compensation element, and to adjust the phase (via optional phase-tuning mechanisms 348 and/or 350) and/or resonance wavelength 324 (via thermal-tuning mechanism 346).

In some embodiments, control logic 344 modifies the phase based on a predefined table of temperatures (such as a look-up table) and associated carrier wavelengths. Consequently, control logic 344 may adjust the phase based on the parameter (such as the temperature) to prevent or to reduce mode-hopping. Note that control logic 344 may also use calculated changes in the optical-mode spacing because of changes in the temperature to determine appropriate changes to optional phase-tuning mechanisms 348 and/or 350 in order to stabilize the optical-cavity lasing mode. This capability may allow hybrid external cavity laser 300 to lock to a given wavelength and to control the shift of this cavity mode.

While tuning of hybrid external cavity laser 300 is illustrated using thermal-tuning mechanism 346, more generally a variety of techniques may be used to vary the tunable wavelengths, including changing the effective index of refraction of ring resonator 322 to change the effective optical length (and, thus, the resonant wavelengths). The index of refraction may be changed using: an electro-optical material (such as a liquid crystal), via charge-carrier injection and/or thermal tuning.

Alternatively or additionally, using one-time 'tuning' the tunable wavelength can be corrected for an offset from a target wavelength. For example, optical waveguides in ring resonator 322 may be oxidized to permanently fix the static difference. In this way, thermal-tuning mechanism 346 may only need to correct changes in the tunable wavelength associated with changes in the ambient temperature or the operating temperature of ring resonator 322.

As shown in FIG. 3, hybrid external cavity laser 300 may include the optical cavity that hybrid integrates the laser gain medium in semiconductor optical amplifier 310, ring resonator 322 and loop mirror 340. However, in general, a wide variety of platforms and integration strategies can be used to implement the optical source. In particular, in addition to the hybrid external cavity laser described previously (with a separate semiconductor optical amplifier 310, which includes a semiconductor other than silicon, and photonic chip 316), in other embodiments the entire optical source is fabricated using a semiconductor material, including the optical gain medium, the optical waveguides, the ring resonator and the interferometer. Alternatively, a germanium-based optical gain medium may be included in a silicon-on-insulator platform so that the entire optical source can be fabricated using group IV semiconductors (other than silicon).

Therefore, hybrid external cavity laser 300 may include or may use a set of techniques to monitor, control, and stabilize the lasing wavelength and to prevent optical mode-hopping. The aforementioned structural changes to hybrid external cavity laser 300 may reduce the amount of wavelength drift experienced by hybrid external cavity laser 300 during operation as the injected current (and, hence, output power), as well as the ambient temperature, change.

Figure 8:
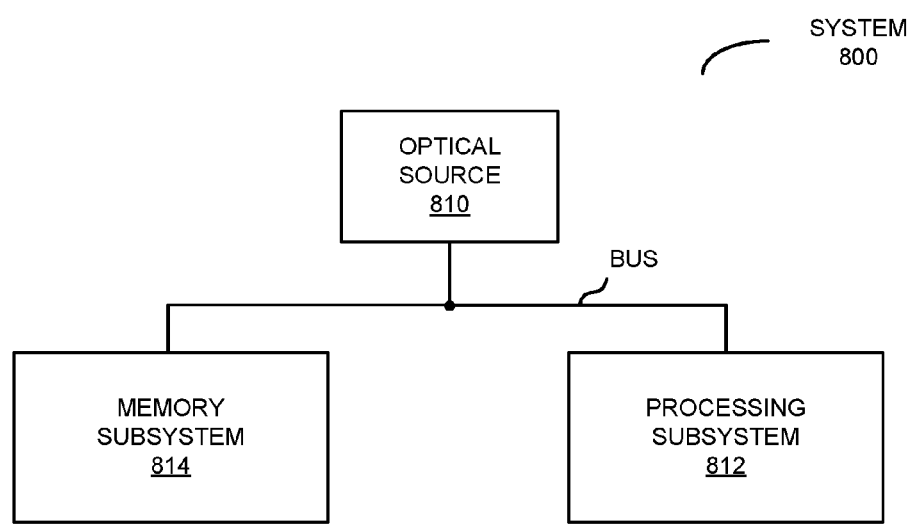
FIG. 8 is a block diagram illustrating a system that includes a hybrid external cavity laser in accordance with an embodiment of the present disclosure.

One or more of the preceding embodiments of the optical source may be included in a system and/or an electronic device. This is shown in FIG. 8, which presents a block diagram illustrating a system 800 that includes optical source 810, such as one of the preceding embodiments of the hybrid external cavity laser. In some embodiments, system 800 includes processing subsystem 812 (with one or more processors) and memory subsystem 814 (with memory).

In general, functions of optical source 810 and system 800 may be implemented in hardware and/or in software. Thus, system 800 may include one or more program modules or sets of instructions stored in a memory subsystem 814 (such as DRAM or another type of volatile or non-volatile computer-readable memory), which, during operation, may be executed by a processing subsystem 812. Note that the one or more computer programs may constitute a computer-program mechanism. Furthermore, instructions in the various modules in memory subsystem 814 may be implemented in: a high-level procedural language, an object-oriented programming language, and/or in an assembly or machine language. Note that the programming language may be compiled or interpreted, e.g., configurable or configured, to be executed by the processing subsystem.

Components in system 800 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 800 may be at one location or may be distributed over multiple, geographically dispersed locations.

System 800 may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 810 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Furthermore, the embodiments of optical source 810 and/or system 800 may include fewer components or additional components. For example, substrate 710 (FIG. 7) may be one of multiple substrates in a multi-chip module (such as a multi-chip module in which alternating facing chips that include routing and bridge layers are coupled using optical proximity communication). Furthermore, a wide variety of fabrication techniques may be used to fabricate the optical source in the preceding embodiments of the optical source, as is known to one of skill in the art. For example, instead of flip-chip or wafer bonding, semiconductor optical amplifier 310 (FIG. 3) may be monolithically integrated onto a silicon-on-insulator substrate by epitaxial growth or using another fabrication technique. In addition, a wide variety of optical components may be used in or in conjunction with the optical source.

Although these embodiments are illustrated as having a number of discrete items, these optical components, integrated circuits and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the optical source, optical source 810 and/or system 800 may be implemented more in hardware and less in software, or less in hardware and more in software, as is known in the art.

While the preceding embodiments have been illustrated with particular elements and compounds, a wide variety of materials and compositions (including stoichiometric and non-stoichiometric compositions) may be used, as is known to one of skill in the art. Thus, while a silicon optical waveguide was illustrated in the preceding embodiments, the communication technique may be used with other materials (such as germanium and/or silicon germanium), as is known to one of skill in the art. Moreover, the semiconductor layer may include polysilicon or amorphous silicon. Furthermore, the materials and compounds in optical source 810 may be fabricated using a wide variety of processing techniques, including: evaporation, sputtering, chemical vapor deposition, molecular-beam epitaxy, wet or dry etching (such as photolithography or direct-write lithography), polishing, etc. In addition, a wide variety of optical components may be used in or in conjunction with the optical device and/or optical source 810.

Figure 9:
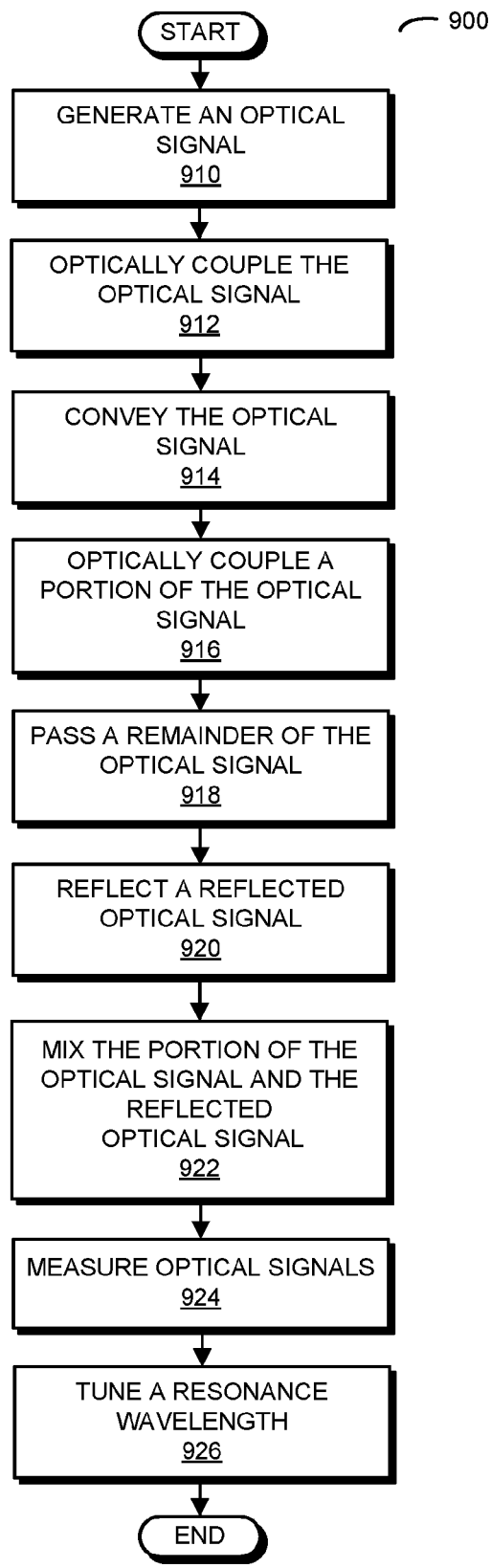
FIG. 9 is a flow chart illustrating a method for providing optical signals in accordance with an embodiment of the present disclosure.

We now describe embodiments of the method. FIG. 9 presents a flow chart illustrating a method 900 for locking a cavity mode for a hybrid external cavity laser, such as one of hybrid external cavity lasers 300 (FIG. 3) and 500 (FIG. 5). During operation of the hybrid external cavity laser, an optical signal is generated (operation 910) in a semiconductor optical amplifier defined in a semiconductor other than silicon, where the semiconductor optical amplifier includes a reflective coating on a first edge, and the semiconductor optical amplifier provides the optical signal at a second edge. Then, the hybrid external cavity laser optically couples the optical signal (operation 912) to a photonic chip, and conveys the optical signal (operation 914) in an optical waveguide on a photonic chip.

Moreover, the hybrid external cavity laser optically couples (operation 916) a portion of the optical signal to a second optical waveguide using a ring resonator having a resonance wavelength, and passes (operation 918) a remainder of the optical signal. Next, the hybrid external cavity laser reflects some of the remainder of the optical signal as a reflected optical signal (operation 920). Furthermore, the hybrid external cavity laser mixes (operation 922) the portion of the optical signal and the reflected optical signal using an interferometer, and measures optical signals (operation 924) output on arms of the interferometer. Note that the interferometer provides homodyne interferences.

Furthermore, the hybrid external cavity laser tunes the resonance wavelength (operation 926) based on the measured optical signals. For example, the hybrid external cavity layer may modify a temperature of the ring resonator using a thermal-tuning mechanism, thermally coupled to the ring resonator, to adjust the resonance wavelength based on the measured optical signals to lock the cavity mode of an optical cavity in the hybrid external cavity laser.

In some embodiments of method 900, there may be additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:
1. An optical source, comprising:
a semiconductor optical amplifier defined in a semiconductor other than silicon, wherein the semiconductor optical amplifier has a first edge and a second edge, includes a reflective coating on the first edge, and, during operation, provides an optical signal at the second edge; and
a photonic chip optically coupled to the semiconductor optical amplifier, wherein the photonic chip includes:

a first optical waveguide having a third edge, optically coupled to the second edge of the semiconductor optical amplifier, and a fourth edge, wherein, during operation, the first optical waveguide conveys the optical signal;

a ring resonator optically coupled to the first optical waveguide between the third edge and the fourth edge, wherein, during operation, the ring resonator drops a portion of the optical signal and passes a remainder of the optical signal;

an interferometer, optically coupled to the fourth edge, that, during operation, receives the remainder of the optical signal and a reflected optical signal and provides a first output signal on a first arm of the interferometer and a second output signal on a second arm of the interferometer;

photodetectors, optically coupled to the first arm and the second arm, that, during operation, respectively measure the first output signal and the second output signal; and control logic, electrically coupled to the photodetectors, that, during operation, tune a resonance wavelength of the ring resonator to match a cavity mode of the optical source based on the measurements of the first output signal and the second output signal.

2. The optical source of claim 1, further comprising:
a second optical waveguide having a fifth edge, optically coupled to the interferometer, and a sixth edge, wherein the second optical waveguide is optically coupled to the ring resonator between the fifth edge and the sixth edge, and wherein, during operation, the second optical waveguide conveys the reflected optical signal; and a loop mirror, optically coupled to the sixth edge, that, during operation, reflects a portion of the optical signal as the reflected optical signal and outputs a remainder of the portion of the optical signal.

3. The optical source of claim 2, further comprising:
a first phase-tuning mechanism, optically coupled to the first optical waveguide, that, during operation, adjusts a phase of the optical signal; and a second phase-tuning mechanism, optically coupled to the second optical waveguide, that, during operation, adjusts a phase of the reflected optical signal.

4. The optical source of claim 1, further comprising a thermal-tuning mechanism electrically coupled to the control logic and thermally coupled to the ring resonator, wherein, during operation, the control logic tunes the resonance wavelength using the thermal-tuning mechanism.

5. The optical source of claim 1, wherein the control logic tunes the resonance wavelength of the ring resonator based on a difference of the measurements of the first output signal and the second output signal.

6. The optical source of claim 1, wherein the first optical waveguide includes a waveguide loop to balance the interferometer by adjusting a phase of the remainder of the optical signal.

7. The optical source of claim 1, wherein the interferometer includes an optical coupler between the first optical waveguide and the second optical waveguide.

8. The optical source of claim 1, wherein the loop mirror includes a directional coupler with its two output ports optically coupled to each other to form a loop.

9. The optical source of claim 1, wherein, when the resonance wavelength is aligned with the cavity mode, a difference of the measurements of the first output signal and the second output signal is zero.

10. The optical source of claim 1, wherein the photonic chip includes:
a substrate;
a buried-oxide layer disposed on the substrate; and
a semiconductor layer disposed on the buried-oxide layer, wherein optical components are defined in the semiconductor layer.

11. A system, comprising:
a processor;
a memory coupled to the processor; and
an optical source, wherein the optical source includes:
a semiconductor optical amplifier defined in a semiconductor other than silicon, wherein the semiconductor optical amplifier has a first edge and a second edge, includes a reflective coating on the first edge, and, during operation, provides an optical signal at the second edge; and a photonic chip optically coupled to the semiconductor optical amplifier, wherein the photonic chip includes:
a first optical waveguide having a third edge, optically coupled to the second edge of the semiconductor optical amplifier, and a fourth edge, wherein, during operation, the first optical waveguide conveys the optical signal;

a ring resonator optically coupled to the first optical waveguide between the third edge and the fourth edge, wherein, during operation, the ring resonator drops a portion of the optical signal and passes a remainder of the optical signal;

an interferometer, optically coupled to the fourth edge, that, during operation, receives the remainder of the optical signal and a reflected optical signal and provides a first output signal on a first arm of the interferometer and a second output signal on a second arm of the interferometer;

a second optical waveguide having a fifth edge, optically coupled to the interferometer, and a sixth edge, wherein the second optical waveguide is optically coupled to the ring resonator between the fifth edge and the sixth edge, and wherein, during operation, the second optical waveguide conveys the reflected optical signal;

a loop mirror, optically coupled to the sixth edge, that, during operation, reflects a portion of the mixed optical signal as the reflected optical signal and outputs a remainder of the portion of the optical signal;

photodetectors, optically coupled to the first arm and the second arm, that, during operation, respectively measure the first output signal and the second output signal; and control logic, electrically coupled to the photodetectors, that, during operation, tune a resonance wavelength of the ring resonator to match a cavity mode of the optical source based on the measurements of the first output signal and the second output signal.

12. An optical source, comprising:
a semiconductor optical amplifier defined in a semiconductor other than silicon, wherein the semiconductor optical amplifier has a first edge and a second edge, includes a reflective coating on the first edge, and, during operation, provides an optical signal at the second edge; and a photonic chip optically coupled to the semiconductor optical amplifier, wherein the photonic chip includes:

a first optical waveguide having a third edge, optically coupled to the second edge of the semiconductor optical amplifier, and a fourth edge, that outputs a portion of the optical signal;

a ring resonator, optically coupled to the first optical waveguide between the third edge and the fourth edge, that, during operation, optically couples a remainder of the optical signal from the first optical waveguide;

a second optical waveguide having a fifth edge and a sixth edge, wherein the optical waveguide is optically coupled to the ring resonator between the fifth edge and the sixth edge;

an interferometer, optically coupled to the fifth edge, that, during operation, receives a reflected optical signal and another a portion of the remainder of the optical signal, and provides a first output signal on a first arm of the interferometer and a second output signal on a second arm of the interferometer;

a third optical waveguide having a seventh edge, optically coupled to the interferometer and an eighth edge;

a loop mirror, optically coupled to the sixth edge and the eighth edge, that, during operation, reflects a portion of the remainder of the optical signal as the reflected optical signal in the second optical waveguide, and passes the other portion of the remainder of the optical signal in the third optical waveguide;

photodetectors, optically coupled to the first arm and the second arm, that, during operation, respectively measure the first output signal and the second output signal; and control logic, electrically coupled to the photodetectors, that, during operation, tune a resonance wavelength of the ring resonator to match a cavity mode of the optical source based on the measurements of the first output signal and the second output signal.

13. The optical source of claim 12, further comprising a thermal-tuning mechanism electrically coupled to the control logic and thermally coupled to the ring resonator, wherein, during operation, the control logic tunes the resonance wavelength using the thermal-tuning mechanism.

14. The optical source of claim 12, wherein the control logic tunes the resonance wavelength of the ring resonator based on a difference of the measurements of the first output signal and the second output signal; and wherein, when the resonance wavelength is aligned with the cavity mode, a difference of the measurements of the first output signal and the second output signal is zero.

15. The optical source of claim 12, further comprising:

a first phase-tuning mechanism, optically coupled to the first optical waveguide, that, during operation, adjusts a phase of the optical signal; and a second phase-tuning mechanism, optically coupled to the third optical waveguide, that, during operation, adjusts a phase of the other portion of the remainder of the optical signal.

16. The optical source of claim 12, wherein the second optical waveguide includes a waveguide loop to balance the interferometer by adjusting a phase of the reflected optical signal in the second optical waveguide.

17. The optical source of claim 12, wherein the interferometer includes an optical coupler between the second optical waveguide and the third optical waveguide.

18. The optical source of claim 12, wherein the loop mirror includes a directional coupler with its two output ports optically coupled to each other to form a loop.

19. The optical source of claim 12, further comprising a power splitter, optically coupled to the third optical waveguide between the seventh edge and the eighth edge, that, during operation, outputs an output optical signal on a second arm of the power splitter; and a fourth optical waveguide having a ninth edge, optically coupled to the power splitter, and a tenth edge, that, during operation, outputs the output optical signal.

20. The optical source of claim 12, wherein the photonic chip includes:

a substrate;

a buried-oxide layer disposed on the substrate; and a semiconductor layer disposed on the buried-oxide layer, wherein optical components are defined in the semiconductor layer.

* * * * *

UNITED STATES PATENT AND TRADEMARK OFFICE
CERTIFICATE OF CORRECTION

PATENT NO. : 9,653,882 B1
APPLICATION NO. : 15/019616
DATED : May 16, 2017
INVENTOR(S) : Xuezhe Zheng et al.

Page 1 of 1

It is certified that error appears in the above-identified patent and that said Letters Patent is hereby corrected as shown below:

On the Title Page

In Assignee Name, please delete, "Oracle America", and replace with --Oracle International Corporation--

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*